(12) United States Patent
Rozman

(10) Patent No.: US 7,385,375 B2
(45) Date of Patent: Jun. 10, 2008

(54) CONTROL CIRCUIT FOR A DEPLETION MODE SWITCH AND METHOD OF OPERATING THE SAME

(75) Inventor: Allen F. Rozman, Murphy, TX (US)

(73) Assignee: ColdWatt, Inc., Austin, TX (US)

( * ) Notice: Subject to any disclaimer, the term of this patent is extended or adjusted under 35 U.S.C. 154(b) by 0 days.

(21) Appl. No.: 11/361,914

(22) Filed: Feb. 23, 2006

(65) Prior Publication Data

US 2006/0198173 A1    Sep. 7, 2006

Related U.S. Application Data

(60) Provisional application No. 60/655,313, filed on Feb. 23, 2005.

(51) Int. Cl.
*G05F 1/618* (2006.01)
*G05F 3/16* (2006.01)

(52) U.S. Cl. .................. 323/224; 323/282; 323/289

(58) Field of Classification Search ........ 323/222–225, 323/271, 282, 284, 285, 289; 361/18
See application file for complete search history.

(56) References Cited

U.S. PATENT DOCUMENTS

| | | |
|---|---|---|
| 1,376,978 A | 5/1921 | Stoekle |
| 3,358,210 A | 12/1967 | Grossoehme |
| 3,433,998 A | 3/1969 | Woelber |
| 3,622,868 A | 11/1971 | Todt |
| 3,681,679 A | 8/1972 | Chung |
| 3,708,744 A | 1/1973 | Stephens et al. |
| 4,019,122 A | 4/1977 | Ryan |
| 4,075,547 A | 2/1978 | Wroblewski |
| 4,327,348 A | 4/1982 | Hirayama |
| 4,471,423 A | 9/1984 | Hase |
| 4,499,481 A | 2/1985 | Greene |
| 4,570,174 A | 2/1986 | Huang et al. |
| 4,577,268 A | 3/1986 | Easter et al. |
| 4,581,691 A | 4/1986 | Hock |
| 4,636,823 A | 1/1987 | Margalit et al. |

(Continued)

FOREIGN PATENT DOCUMENTS

JP    3-215911    9/1991

(Continued)

OTHER PUBLICATIONS

U.S. Appl. No. 11/211,964, filed Aug. 25, 2005, Brar, et al.

(Continued)

*Primary Examiner*—Gary L. Laxton
(74) *Attorney, Agent, or Firm*—Slater & Matsil, L.L.P.

(57) ABSTRACT

A control circuit for a power converter employing a depletion mode switch and a method of operating the same. In one embodiment, the control circuit includes a controller configured to control the depletion mode switch by providing a drive signal to a control terminal thereof as a function of a characteristic of the power converter. The control circuit also includes a protection circuit configured to induce an application of a drive signal having a non-zero value to the control terminal to substantially disable the depletion mode switch in response to a transient condition of the power converter.

20 Claims, 4 Drawing Sheets

U.S. PATENT DOCUMENTS

| | | |
|---|---|---|
| 4,660,136 A | 4/1987 | Montorefano |
| 4,823,249 A | 4/1989 | Garcia, II |
| 4,887,061 A | 12/1989 | Matsumura |
| 4,899,271 A | 2/1990 | Seiersen |
| 4,903,089 A | 2/1990 | Hollis et al. |
| 4,999,759 A | 3/1991 | Cavagnolo et al. |
| 5,027,264 A | 6/1991 | DeDoncker et al. |
| 5,068,756 A | 11/1991 | Morris et al. |
| 5,106,778 A | 4/1992 | Hollis et al. |
| 5,126,714 A | 6/1992 | Johnson |
| 5,132,888 A | 7/1992 | Lo et al. |
| 5,134,771 A | 8/1992 | Lee et al. |
| 5,206,621 A | 4/1993 | Yerman |
| 5,223,449 A | 6/1993 | Morris et al. |
| 5,231,037 A | 7/1993 | Yuan et al. |
| 5,244,829 A | 9/1993 | Kim |
| 5,291,382 A | 3/1994 | Cohen |
| 5,305,191 A | 4/1994 | Loftus, Jr. |
| 5,335,163 A | 8/1994 | Seiersen |
| 5,336,985 A | 8/1994 | McKenzie |
| 5,342,795 A | 8/1994 | Yuan et al. |
| 5,369,042 A | 11/1994 | Morris et al. |
| 5,374,887 A | 12/1994 | Drobnik |
| 5,407,842 A | 4/1995 | Morris et al. |
| 5,468,661 A | 11/1995 | Yuan et al. |
| 5,508,903 A | 4/1996 | Alexndrov |
| 5,554,561 A | 9/1996 | Plumton |
| 5,555,494 A | 9/1996 | Morris |
| 5,610,085 A | 3/1997 | Yuan et al. |
| 5,624,860 A | 4/1997 | Plumton et al. |
| 5,663,876 A | 9/1997 | Newton et al. |
| 5,700,703 A | 12/1997 | Huang et al. |
| 5,712,189 A | 1/1998 | Plumton et al. |
| 5,719,544 A | 2/1998 | Vinciarelli et al. |
| 5,734,564 A | 3/1998 | Brkovic |
| 5,736,842 A | 4/1998 | Jovanovic |
| 5,742,491 A | 4/1998 | Bowman et al. |
| 5,747,842 A | 5/1998 | Plumton |
| 5,756,375 A | 5/1998 | Celii et al. |
| 5,760,671 A | 6/1998 | Lahr et al. |
| 5,783,984 A | 7/1998 | Keuneke |
| 5,784,266 A | 7/1998 | Chen |
| 5,804,943 A | 9/1998 | Kollman et al. |
| 5,815,386 A | 9/1998 | Gordon |
| 5,870,299 A | 2/1999 | Rozman |
| 5,886,508 A | 3/1999 | Jutras |
| 5,889,298 A | 3/1999 | Plumton et al. |
| 5,909,110 A | 6/1999 | Yuan et al. |
| 5,910,665 A | 6/1999 | Plumton et al. |
| 5,920,475 A | 7/1999 | Boylan et al. |
| 5,925,088 A | 7/1999 | Nasu |
| 5,933,338 A | 8/1999 | Wallace |
| 5,940,287 A * | 8/1999 | Brkovic ..................... 363/127 |
| 5,956,245 A | 9/1999 | Rozman |
| 5,956,578 A | 9/1999 | Weitzel et al. |
| 5,999,066 A | 12/1999 | Saito et al. |
| 6,008,519 A | 12/1999 | Yuan et al. |
| 6,011,703 A | 1/2000 | Boylan et al. |
| 6,038,154 A | 3/2000 | Boylan et al. |
| 6,067,237 A | 5/2000 | Nguyen |
| 6,069,799 A | 5/2000 | Bowman et al. |
| 6,084,792 A | 7/2000 | Chen et al. |
| 6,094,038 A | 7/2000 | Lethellier |
| 6,097,046 A | 8/2000 | Plumton |
| 6,156,611 A | 12/2000 | Lan et al. |
| 6,163,466 A | 12/2000 | Davila, Jr. et al. |
| 6,181,231 B1 | 1/2001 | Bartilson |
| 6,188,586 B1 | 2/2001 | Farrington et al. |
| 6,191,964 B1 | 2/2001 | Boylan et al. |
| 6,208,535 B1 | 3/2001 | Parks |
| 6,215,290 B1 | 4/2001 | Yang et al. |
| 6,218,891 B1 | 4/2001 | Lotfi et al. |
| 6,229,197 B1 | 5/2001 | Plumton et al. |
| 6,262,564 B1 * | 7/2001 | Kanamori ..................... 323/224 |
| 6,309,918 B1 | 10/2001 | Huang et al. |
| 6,320,490 B1 | 11/2001 | Clayton |
| 6,323,090 B1 | 11/2001 | Zommer |
| 6,348,848 B1 | 2/2002 | Herbert |
| 6,351,396 B1 | 2/2002 | Jacobs |
| 6,356,462 B1 | 3/2002 | Jang et al. |
| 6,362,986 B1 | 3/2002 | Schultz et al. |
| 6,380,836 B2 | 4/2002 | Matsumoto et al. |
| 6,388,898 B1 | 5/2002 | Fan et al. |
| 6,392,902 B1 | 5/2002 | Jang et al. |
| 6,414,578 B1 | 7/2002 | Jitaru |
| 6,477,065 B2 | 11/2002 | Parks |
| 6,483,724 B1 | 11/2002 | Blair et al. |
| 6,489,754 B2 | 12/2002 | Blom |
| 6,498,367 B1 * | 12/2002 | Chang et al. ................ 257/341 |
| 6,501,193 B1 | 12/2002 | Krugly |
| 6,512,352 B2 | 1/2003 | Qian |
| 6,525,603 B1 | 2/2003 | Morgan |
| 6,539,299 B2 | 3/2003 | Chatfield et al. |
| 6,549,436 B1 | 4/2003 | Sun |
| 6,661,276 B1 | 12/2003 | Chang |
| 6,683,797 B2 | 1/2004 | Zaitsu et al. |
| 6,696,910 B2 | 2/2004 | Nuytkens et al. |
| 6,731,486 B2 * | 5/2004 | Holt et al. .................. 361/91.1 |
| 6,741,099 B1 | 5/2004 | Krugly |
| 6,753,723 B2 * | 6/2004 | Zhang ......................... 327/540 |
| 6,765,810 B2 | 7/2004 | Perry |
| 6,775,159 B2 | 8/2004 | Webb et al. |
| 6,867,678 B2 | 3/2005 | Yang |
| 6,873,237 B2 | 3/2005 | Chandrasekaran et al. |
| 6,944,033 B1 | 9/2005 | Xu et al. |
| 6,980,077 B1 | 12/2005 | Chandrasekaran et al. |
| 7,012,414 B1 | 3/2006 | Mehrotra et al. |
| 7,034,586 B2 * | 4/2006 | Mehas et al. ................ 327/143 |
| 7,046,523 B2 | 5/2006 | Sun et al. |
| 7,076,360 B1 | 7/2006 | Ma |
| 7,280,026 B2 | 10/2007 | Chandrasekaran et al. |
| 7,285,807 B2 | 10/2007 | Brar et al. |
| 7,298,118 B2 | 11/2007 | Chandrasekaran |
| 2002/0114172 A1 | 8/2002 | Webb et al. |
| 2003/0197585 A1 | 10/2003 | Chandrasekaran et al. |
| 2003/0198067 A1 | 10/2003 | Sun et al. |
| 2005/0024179 A1 | 2/2005 | Chandrasekaran et al. |
| 2006/0038549 A1 | 2/2006 | Mehrotra et al. |
| 2006/0038649 A1 | 2/2006 | Mehrotra et al. |
| 2006/0038650 A1 | 2/2006 | Mehrotra et al. |
| 2006/0187684 A1 | 8/2006 | Chandrasekaran et al. |
| 2006/0197510 A1 | 9/2006 | Chandrasekaran |
| 2006/0226477 A1 | 10/2006 | Brar et al. |
| 2006/0226478 A1 | 10/2006 | Brar et al. |
| 2006/0255360 A1 | 11/2006 | Brar et al. |

FOREIGN PATENT DOCUMENTS

| | | |
|---|---|---|
| JP | 2000-68132 | 3/2000 |

OTHER PUBLICATIONS

U.S. Appl. No. 11/236,376, filed Sep. 27, 2005, Brar, et al.

Ajram, S., et al., "Ultrahigh Frequency DC-to-DC Converters Using GaAs Power Switches," IEEE Transactions on Power Electronics, Sep. 2001, pp. 594-602, vol. 16, No. 5, IEEE, Los Alamitos, CA.

"AN100: Application Note using Lx100 Family of High Performance N-Ch JFET Transistors," Sep. 2003, 5 pp., Lovoltech, Inc., Santa Clara, CA.

"AN101A: Gate Drive Network for a PowerJFET," Nov. 2003, 2 pp., Lovoltech, Inc., Santa Clara, CA.

"AN108: Applications Note: How to Use Power JFETs® and MOSFETs Interchangeably in Low-Side Applications," 02-14-2005, 4 pp., Lovoltech, Inc., Santa Clara, CA.

Biernacki, J., et al., "Radio Frequency DC-DC Flyback Converter," Proceedings of the 43rd IEEE Midwest Symposium on Circuits and Systems, Aug. 2000, pp. 94-97, vol. 1, IEEE, Los Alamitos, CA.

Eisenbeiser, K., et al., "Manufacturable GaAs VFET for Power Switching Applications," IEEE Electron Device Letters, Apr. 2000, pp. 144-145, vol. 21, No. 4, IEEE.

Gaye, M., et al., "A 50-100 MHz 5 V to -5 V, 1 W Cuk Converter Using Gallium Arsenide Power Switches," ISCAS 2000—IEEE International Symposium on Circuits and Systems, May 2000, pp. 264-267, vol. 1, IEEE, Geneva, Switzerland.

Goldberg, A.F., et al., "Issues Related to 1—10-MHz Transformer Design," IEEE Transactions on Power Electronics, Jan. 1989, pp. 113-123, vol. 4, No. 1, IEEE, Los Alamitos, CA.

Goldberg, A.F., et al., "Finite-Element Analysis of Copper Loss in 1—10-MHz Transformers," IEEE Transactions on Power Electronics, Apr. 1989, pp. 157-167, vol. 4, No. 2, IEEE, Los Alamitos, CA.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE.

Liu, W., "Fundamentals of III-V Devices: HBTs, MESFETs, and HFETs/HEMTs," §5-5: Modulation Doping, 1999, pp. 323-330, John Wiley & Sons, New York, NY.

Nguyen, L.D., et al., "Ultra-High-Speed Modulation, Doped Field-Effect Transistors: A Tutorial Review," Proceedings of the IEEE, Apr. 1992, pp. 494-518, vol. 80, No. 4, IEEE.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE.

Plumton, D.L., et al., "A Low On-Resistance High Current GaAs Power VFET," IEEE Electron Device Letters, Apr. 1995, pp. 142-144, vol. 16, No. 4, IEEE.

Weitzel, C.E., "RF Power Devices for Wireless Communications," 2002, 2002 IEEE MTT-S CDROM, paper TU4B-1, IEEE.

Williams, R., "Modern GaAs Processing Methods," 1990, pp. 66-67, Artech House, Inc., Norwood, MA.

Balogh, L., et al., "Power-Factor Correction with Interleaved Boost Converters in Continuous-Inductor-Current Mode," IEEE Proceedings of APEC, pp. 168-174, 1993, IEEE, Los Alamitos, CA.

Chen, W., et al., "Design of High Efficiency, Low Profile, Low Voltage Converter with Integrated Magnetics," Proceedings of 1997 IEEE Applied Power Electronics Conference (APEC '97), 1997, pp. 911-917, IEEE, Los Alamitos, CA.

Jitaru, I.D., et al., "Quasi-Integrated Magnetic An Avenue for Higher Power Density and Efficiency in Power Converters," Twelfth Annual Applied Power Electronics Conference and Exposition, Feb. 23-27, 1997, pp. 395-402, vol. 1, IEEE, Los Alamitos, CA.

Lee, P.-W., et al., "Steady-State Analysis of an Interleaved Boost Converter with Coupled Inductors," IEEE Transactions on Industrial Electronics, Aug. 2000, pp. 787-795, vol. 47, No. 4, IEEE, Los Alamitos, CA.

MIWA, B.A., et al., "High Efficiency Power Factor Correction Using Interleaving Techniques," IEEE Proceedings of APEC, 1992, pp. 557-568, IEEE, Los Alamitos, CA.

Ninomiya, T., et al., "Static and Dynamic Analysis of Zero-Voltage-Switched Half-Bridge Converter with PWM Control," Proceedings of 1991 IEEE Power Electronics Specialists Conference (PESC '91), 1991, pp. 230-237, IEEE, Los Alamitos, CA.

O'Meara, K., "A New Output Rectifier Configuration Optimized for High Frequency Operation," Proceedings of 1991 High Frequency Power Conversion (HFPC '91) Conference, Jun. 1991, pp. 219-225, Toronto, CA.

Peng, C., et al., "A New Efficient High Frequency Rectifier Circuit," Proceedings of 1991 High Frequency Power Conversion (HFPC '91) Conference, Jun. 1991, pp. 236-243, Toronto, CA.

Pietkiewicz, A., et al. "Coupled-Inductor Current-Doubler Topology in Phase-Shifted Full-Bridge DC-DC Converter," Proceedings of INTELEC '98, 1998, 9 pp., Paper 2-3, IEEE, Los Alamitos, CA.

Rajeev, M., "An Input Current Shaper with Boost and Flyback Converter Using Integrated Magnetics," Power Electronics and Drive Systems, Fifth International Conference on Power Electronics and Drive Systems 2003, Nov. 17-20, 2003, pp. 327-331, vol. 1, IEEE, Los Alamitos, CA.

Severns, R., "Circuit Reinvention in Power Electronics and Identification of Prior Work," Proceedings of 1997 IEEE Applied Power Electronics Conference (APEC '97), 1997, pp. 3-9, IEEE, Los Alamitos, CA.

Severns, R., "Circuit Reinvention in Power Electronics and Identification of Prior Work," IEEE Transactions on Power Electronics, Jan. 2001, pp. 1-7, vol. 16, No. 1, IEEE, Los Alamitos, CA.

Sun, J., et al., "Unified Analysis of Half-Bridge Converters with Current-Doubler Rectifier," Proceedings of 2001 IEEE Applied Power Electronics Conference, 2001, pp. 514-520, IEEE, Los Alamitos, CA.

Xu, P., et al., "Design of 48 V Voltage Regulator Modules with a Novel Integrated Magnetics," IEEE Transactions on Power Electronics, Nov. 2002, pp. 990-998, vol. 17, No. 6, IEEE, Los Alamitos, CA.

Xu, P., et al., "A Family of Novel Interleaved DC/DC Converters for Low-Voltage High-Current Voltage Regulator Module Applications," IEEE Power Electronics Specialists Conference, Jun. 2001, pp. 1507-1511, IEEE, Los Alamitos, CA.

Xu, P., et al., "A Novel Integrated Current Doubler Rectifier," IEEE 2000 Applied Power Electronics Conference, Mar. 2000, pp. 735-740, IEEE, Los Alamitos, CA.

Zhou, X., et al., "A High Power Density, High Efficiency and Fast Transient Voltage Regulator Module with a Novel Current Sensing and Current Sharing Technique," IEEE Applied Power Electronics Conference, Mar. 1999, pp. 289-294, IEEE, Los Alamitos, CA.

Zhou, X., et al., "Investigation of Candidate VRM Topologies for Future Microprocessors," IEEE Applied Power Electronics Conference, Mar. 1998, pp. 145-150, IEEE, Los Alamitos, CA.

Lenk, R., "Introduction to the Tapped Buck Converter," PCIM 2000, HFPC 2000 Proceedings, Oct. 2000, pp. 155-166.

Maksimović, D., et al., "Switching Converters with Wide DC Conversion Range," IEEE Transactions on Power Electronics, Jan. 1991, pp. 151-157, vol. 6, No. 1, IEEE, Los Alamitos, CA.

Middlebrook, R.D., "Transformerless DC-to-DC Converters with Large Conversion Ratios," IEEE Transactions on Power Electronics, Oct. 1988, pp. 484-488, vol. 3, No. 4, IEEE, Los Alamitos, CA.

Rico, M., et al., "Static and Dynamic Modeling of Tapped-Inductor DC-to-DC Converters," 1987, pp. 281-288, IEEE, Los Alamitos, CA.

Thaker, M., et al., "Adaptive/Intelligent Control and Power Management Reduce Power Dissipation and Consumption," Digital Power Forum '06, 11 pp., Sep. 2006, Darnell Group, Richardson, TX.

Wei, J., et al., "Comparison of Three Topology Candidates for 12V VRM," IEEE APEC, 2001, pp. 245-251, IEEE, Los Alamitos, CA.

Xu, P., et al., "Design and Performance Evaluation of Multi-Channel Interleaved Quasi-Square-Wave Buck Voltage Regulator Module," HFPC 2000 Proceedings, Oct. 2000, pp. 82-88.

* cited by examiner

CONTROL CIRCUIT FOR A DEPLETION MODE SWITCH AND METHOD OF OPERATING THE SAME

This application claims the benefit of U.S. Provisional Application Ser. No. 60/655,313, entitled "Circuit and Method for Protecting a Switching Device," filed on Feb. 23, 2005, which is incorporated herein by reference.

TECHNICAL FIELD

The present invention is directed, in general, to power electronics and, in particular, to a control circuit for a power converter employing a depletion mode switch and method of operating the same.

BACKGROUND

A switched-mode power converter (also referred to as a "power converter") is an electronic power processing circuit that converts an input voltage waveform into an output voltage waveform. The waveforms are typically, but not necessarily, dc waveforms, controlled by periodically switching power switches or switches coupled to an inductive circuit element. The switches are generally controlled with a conduction period "D" referred to as a "duty cycle." The duty cycle is a ratio represented by the conduction period of a switch to a switching period thereof. Thus, if a switch conducts for half of the switching period, the duty cycle for the power switch would be 0.5 (or 50 percent).

Feedback controllers associated with power converters manage an operation thereof by controlling the conduction period of a switch employed therein. Generally, a feedback controller is coupled to an output of a power converter in a feedback loop configuration (also referred to as a "control loop" or "closed control loop") to regulate a characteristic (e.g., an output characteristic) of the power converter such as an output voltage. A switched-mode power converter typically receives a dc input voltage $V_{in}$ from a source of electrical power at input nodes thereof and provides a regulated output voltage $V_{out}$ at output nodes thereof to power, for instance, a microprocessor coupled to the output nodes of the power converter.

Advances in microprocessors and other electronic technologies impose challenges in the design of the power supplies required to meet increasingly stringent power requirements thereof. In order to deliver a highly accurate supply voltage to the microprocessors, it is often necessary to place a voltage regulator module in the form of a dedicated dc-dc converter in close proximity thereto. The stringent regulation requirements and high load fluctuations exhibited by the microprocessors are forcing power converters to operate at ever higher switching frequencies to, among other benefits, reduce the size of the power converter and increase the ability of the power converter to respond to the load fluctuations. The high frequency operation, however, can have a detrimental effect on the efficiency of the power converter, as a significant amount of power is necessary to drive the control terminals of the switches such as the gate terminals of metal-oxide semiconductor field-effect transistors ("MOSFETs") at higher frequencies.

Additionally, the introduction of semiconductor devices employable as switches based on group III-V semiconductor materials such as gallium arsenide ("GaAs"), indium-phosphide ("InP"), or indium gallium arsenide ("InGaAs"), to cite just a few examples, further lead to the design of power converters capable of switching at higher frequencies without incurring the detrimental gate drive losses of silicon based devices. For general information on group III-V semiconductor devices and, in particular, gallium arsenide devices, see *Fundamentals of III-V Devices*, by W. Liu, published by John Wiley and Sons (1999), and *Modern GaAs Processing Methods*, by R. Williams, published by Artech House (1990), which are incorporated herein by reference.

The lack of a native oxide for many of the group III-V semiconductor devices makes the construction of a true enhancement mode MOSFET difficult. Consequently, group III-V semiconductor devices are often fabricated as depletion mode switches, which exhibit a finite, and typically low resistance with zero volts applied to the gate terminal thereof. Fully turning off the depletion mode switch may require the application of a non-zero signal such as a negative signal (e.g., a negative gate-to-source voltage) thereto. While the application of a negative gate-to-source voltage is somewhat straightforward during steady state operation of the power converter employing such a switch, the requirement for a negative gate-to-source voltage may be problematic during non-steady state operations of the power converter or when the converter and switch are subject to transient conditions. The transient conditions typically occur during startup and shut down of the power converter, during fault conditions or protection periods of operation, or whenever the switch(es) of the power converter need to be configured off with input and/or output voltages applied thereto, to name a few.

A conventional enhancement mode MOSFET does not typically require special care during some or all of the non-steady state operations described above because the enhancement mode MOSFET exhibits a high resistance and is typically off (i.e., disabled to conduct) with the application of zero gate-to-source voltages, and a positive voltage is typically required to turn the switch on. As a normally off switch, an input voltage of the power converter may be safely applied to the enhancement mode MOSFETs (again, a high impedance switch) without detrimental effects thereto or to the power converter. A power converter employing depletion mode switches, on the other hand, may exhibit low input impedance as the input voltage is applied for the reasons discussed above. Special circuitry and/or procedures may be necessary to prevent excessive current flow during the non-steady state operations of the power converter.

Accordingly, what is needed in the art is a circuit and method of operating a power converter that employs depletion mode switches taking into account non-steady state operations thereof and adapted to apply a suitable signal to turn the switch(es) off (or disable the switch(es)) at the appropriate times to prevent a detrimental impact on the power converter and devices (including the switch(es)) therein, that overcomes the deficiencies in the prior art.

SUMMARY OF THE INVENTION

These and other problems are generally solved or circumvented, and technical advantages are generally achieved, by advantageous embodiments of the present invention that include a control circuit for a power converter employing a depletion mode switch and a method of operating the same. In one embodiment, the control circuit includes a controller configured to control the depletion mode switch by providing a drive signal to a control terminal thereof as a function of a characteristic of the power converter. The control circuit also includes a protection circuit configured to induce an application of a drive signal having a non-zero value to the control terminal to substantially disable the depletion mode switch in response to a transient condition of the power converter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Unless otherwise provided, like designators for devices employed in different embodiments illustrated and described herein do not necessarily mean that the similarly designated devices are constructed in the same manner or operate in the same way. It should also be understood that the use of the terms such as "first" and "second" are employed for purposes of explanation and clarity, and reversing such designations when referring to device(s) is well within the broad scope of the present invention.

The invention will be described with respect to an exemplary embodiment in a specific context, namely, a power converter employing at least one switch that may be enabled to conduct, or at least partially conduct, when zero volts (or substantially zero volts) are applied to a control terminal thereof. A particular embodiment described herein is a dc-dc power converter topology including group III-V compound semiconductor depletion mode switches such as gallium arsenide switches to apply a switched-voltage waveform to an output filter. For examples of semiconductor devices employable as switches, see U.S. patent application Publication No. 2006/0226478, entitled *Semiconductor Device having a Lateral Channel and Contacts on Opposing Surfaces Thereof*, to Brar, et al., published Oct. 12, 2006, U.S. patent application Publication No. 2006/0255360, entitled *Semiconductor Device having Multiple Lateral Channels and Method of Forming the Same*, to Brar, et al., published Nov. 16, 2006, U.S. Pat. No. 7,285,807, entitled *Semiconductor Device having Substrate-Driven Field-Effect Transistor and Schottky Diode and Method of Forming the Same*, to Brar, et al., issued Oct. 23, 2007, and U.S. patent application Publication No. 2007/0069286, entitled *Semiconductor Device having an Interconnect with Sloped Walls and Method of Forming the Same*, to Brar, et al., published Mar. 29, 2007, all of which are incorporated herein by reference. The principles of the present invention may be applied to other switch-mode power converters or power converters including, without limitation, power converters with isolation transformers and to other power converter topologies such as flyback, bridge-type and boost power converter topologies.

Figure 1:
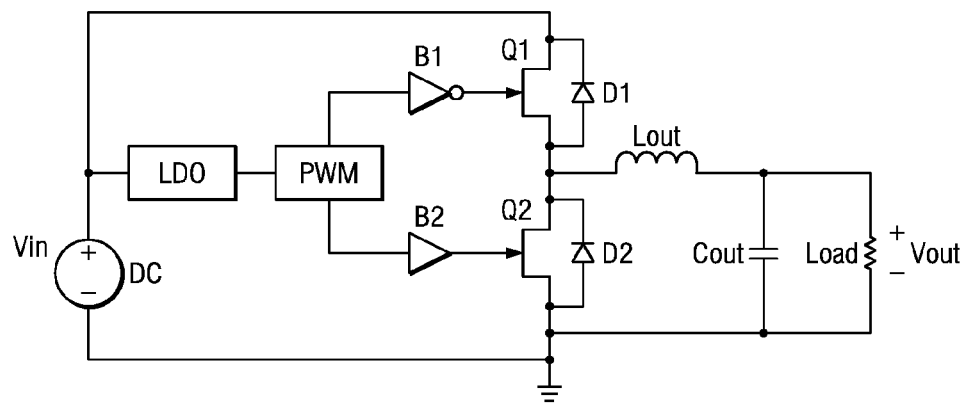
FIG. 1 illustrates a schematic diagram of an embodiment of a power converter constructed according to the principles of the present invention.

Referring initially to FIG. 1, illustrated is a schematic diagram of an embodiment of a power converter constructed according to the principles of the present invention. The power converter employs a buck power converter topology with main and auxiliary switches Q1, Q2 being depletion mode switches such as group III-V compound semiconductor depletion mode switches. A depletion mode switch is a switch that conducts with zero volts (or substantially zero volts) applied to a control terminal thereof, and is substantially disabled to conduct when a negative signal is applied to the control terminal. Of course, a switch of the opposite sense that conducts with zero volts (or substantially zero volts) applied to a control terminal thereof, and is substantially disabled to conduct when a positive signal is applied to the control terminal is also within the broad scope of the present invention. The main and auxiliary switches Q1, Q2 are assumed, without restriction, to be formed with control terminals akin to control terminals (e.g., gate terminals) of junction field-effect transistors, which exhibit diode characteristics with respect to a source terminal thereof. The main and auxiliary switches Q1, Q2 with fully insulated gate terminals can also be provided with well known modifications to the power converter. A general operation of a conventional buck power converter and its associated pulse-width modulator is also well known in the art and will not herein be discussed in detail.

In accordance therewith, a control circuit should be capable of quickly disabling or substantially disabling conduction (also referred to as "disable" or "disabling") of one or more of the main and auxiliary switches Q1, Q2 (at least to some acceptable impedance level) as the input voltage Vin of a source of electrical power is increased or during a transient condition of the power converter. Otherwise, an unacceptably high input current could result, either as a shoot-through current from the main switch Q1 through the auxiliary switch Q2 or a high current from the source of electrical power through the main switch Q1 to the load. Additionally, the control circuit should be designed to quickly disable the conduction of the main and/or auxiliary switches Q1, Q2 as the input voltage Vin is increased to protect the main and/or auxiliary switches Q1, Q2 switches as well as other components of the power converter from unnecessarily high currents (or voltages). Otherwise, particularly during startup or shut down of the power converter, or during other transient conditions, components can be damaged or detrimental operation of the power converter or the load coupled to output nodes of the power converter may result.

As part of a controller of the control circuit, a pulse-width modulator (designated "PWM") provides control signals (as a function of a characteristic such as an output voltage Vout of the power converter) for first and second drivers (typically, first and second gate drivers designated "B1" and "B2"), which provide drive signals to the control terminals (typically, the gate terminals) of the main and auxiliary switches Q1, Q2, respectively. Thus, the controller controls the main and auxiliary switches Q1, Q2 by providing drive signals to control terminals thereof as a function of a characteristic of the power converter. The first driver B1 is a high-side driver capable of driving the control terminal of the main switch Q1 with the source terminal thereof not referenced to ground potential. First and second diodes D1, D2 represent body diodes formed within the die of each semiconductor device forming the main and auxiliary switches Q1, Q2, respectively, or discrete diodes coupled in parallel with the main and auxiliary switches Q1, Q2, respectively. The pulse-width modulator PWM may derive a bias voltage (for control and housekeeping) from a low drop-out regulator (designated "LDO") or other suitable bias power generation circuits. The control circuit also includes a protection circuit that induces an application of a drive signal having a non-zero value such as a negative value (e.g., a negative gate-to-source voltage) to the control terminals (again, gate terminals) to substantially disable the main and/or auxiliary switches Q1, Q2 in response to transient conditions of the power converter will be described in more detail below. The negative gate-to-source voltage may be derived from the low drop-out regulator LDO, for example. An output filter for the power converter includes an output inductor Lout and an output capacitor Cout, typically producing a substantially dc output voltage Vout. The load for the power supply is illustrated by a resistor (designated "Load").

Figure 2:
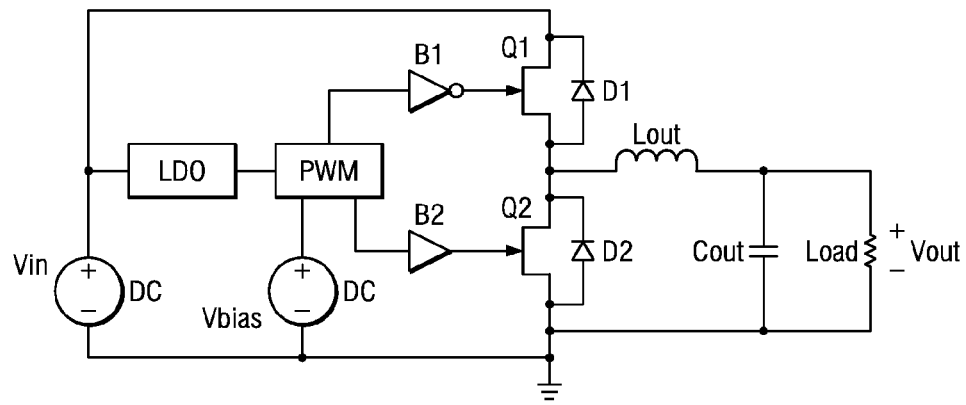
FIG. 2 illustrates a schematic diagram of another embodiment of a power converter constructed according to the principles of the present invention.

Turning now to FIG. 2, illustrated is a schematic diagram of another embodiment of a power converter constructed according to the principles of the present invention. In addition to the buck power converter topology with main and/or auxiliary switches Q1, Q2 being depletion mode switches as illustrated and described with respect to FIG. 1, the power converter of FIG. 2 includes a bias supply that provides a bias voltage Vbias to power portions of the power converter. While the bias supply is coupled to a pulse-width modulator (designated "PWM") of a controller in the illustrated embodiment, the bias voltage Vbias may be employed to power other sections of the power converter and control circuit, in general, including a protection circuit as described below. A bias voltage Vbias may also be derived, or partially derived, from a low drop-out regulator (designated "LDO").

The bias voltage Vbias may be provided before, or concurrently with, the input voltage Vin of the power converter ramping up. As mentioned above, the bias supply may be used to power the protection circuit, thereby preventing excessive input current whenever the input voltage Vin is applied. Of course, more than one bias supply may be used, or the bias supply may be configured to produce a drive signal having a non-zero value such as a negative value to facilitate the generation of a negative gate to source voltage for main and/or auxiliary switches Q1, Q2. The remaining elements of the power converter are analogous to like elements illustrated and described with respect to the preceding FIGUREs and, in the interest of brevity, will not hereinafter be repeated. Thus, the negative gate to source voltage for main and/or auxiliary switches Q1, Q2 may be derived from the bias supply.

Figure 3:
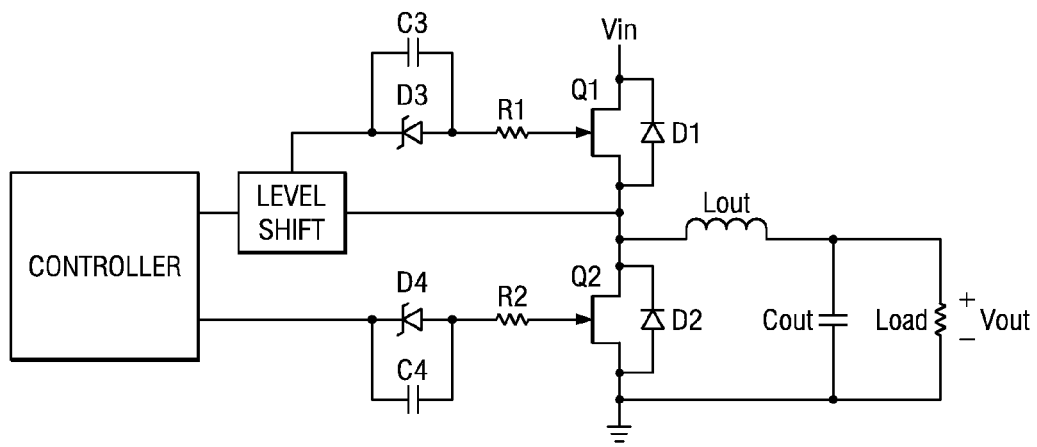
FIG. 3 illustrates a schematic diagram of another embodiment of a power converter constructed according to the principles of the present invention.

Turning now to FIG. 3, illustrated is a schematic diagram of another embodiment of a power converter constructed according to the principles of the present invention. The power converter employs a buck power converter topology with main and/or auxiliary switches Q1, Q2 being depletion mode switches such as group III-V compound semiconductor depletion mode switches. A controller of a control circuit controls the main and auxiliary switches Q1, Q2 by providing a drive signal to a control terminal (e.g., a gate terminal) thereof as a function of a characteristic such as an output voltage Vout of the power converter. The control circuit also includes first and second dc offset circuits coupled between the controller and the main and auxiliary switches Q1, Q2. The first dc offset circuit includes a resistor R1 series coupled to a parallel combination of a capacitor C3 and a zener diode D3, which provides a bias voltage in conjunction with a protection circuit to provide a drive signal having a non-zero value such as a negative value to the gate terminal to substantially disable the main switch Q1. The second dc offset circuit includes a resistor R2 series coupled to a parallel combination of a capacitor C4 and a zener diode D4, which provides a bias voltage in conjunction with a protection circuit to provide a drive signal having a non-zero value such as a negative value to the gate terminal to substantially disable the auxiliary switch Q2.

Commercially available pulse-width modulators or driver integrated circuits are typically designed to provide a positive voltage to turn on a switch and zero volts (or substantially zero volts) to turn the switch off. With the control circuit of FIG. 3, a positive voltage (a drive signal in the form of a drive voltage) from the controller via the capacitor C4 and the zener diode D4 of the second dc offset circuit causes the auxiliary switch Q2 to turn on. The zener diode D4 allows the creation of a dc voltage on the capacitor C4. When the drive voltage transitions low, the charge stored on capacitor C4 applies a drive signal having a negative value (e.g., a negative gate-to-source voltage) to the gate terminal of the auxiliary switch Q2, thereby turning it off. The same principle applies regarding the control of the main switch Q1 with the addition of a level shifter in the path between the controller and the main switch Q1. An example of a level shifter is provided in a data sheet FN9159.5 for ISL6612A, ISL6613A, Advanced Synchronous Rectifier Buck MOSFET Drivers with Pre-POR OVP, provided by Intersil Americas, Inc, Dec. 1, 2005, which is incorporated herein by reference. By sizing the capacitance value of the capacitor C4 to be substantially greater than the input capacitance of the auxiliary switch Q2, the capacitor C4 can maintain the auxiliary switch Q2 off for an extended period of time. The resistors R1, R2 associated with the first and second dc offset circuits may be used to control overshoot and voltage ringing at the gate terminals for the main and auxiliary switches Q1, Q2.

One of the desirable attributes of using group III-IV compound semiconductor switches is that the devices typically switch very fast (on the order of one nanosecond), and the gate capacitance and gate charge are very low compared to commonly available silicon-based switches. Therefore, the protection circuit as described herein can operate in a manner whereby the protection circuit pulses, for example, the auxiliary switch Q2 on for a very brief period, long enough to build up charge on the capacitor C4. The protection circuit then uses the charge on the capacitor C4 to substantially disable conduction of the auxiliary switch Q2 (sometimes referred to as a charge pump). Such a sufficiently brief "on" pulse such as an on pulse of several nanoseconds, typically will not result in a current level high enough to cause a problem in the control circuit. In addition, if the protection circuit needs to disable conduction of the auxiliary switch Q2 for an extended period of time, it could go into a refresh mode of operation, whereby the gate terminal of the auxiliary switch Q2 is pulsed as needed to maintain a charge on the capacitor C4. The protection circuit may include circuitry capable of running at a very low voltage, such that the protection circuit may substantially disable conduction of the main and auxiliary switches Q1, Q2 on the fly, as the input voltage Vin comes up. Alternatively, the protection circuit may employ a bias supply to assist in disabling a conduction of the main and auxiliary switches Q1, Q2 prior to the input voltage Vin coming up. The remaining elements of the power converter are analogous to like elements illustrated and described with respect to the preceding FIGUREs and, in the interest of brevity, will not hereinafter be repeated.

Figure 4:
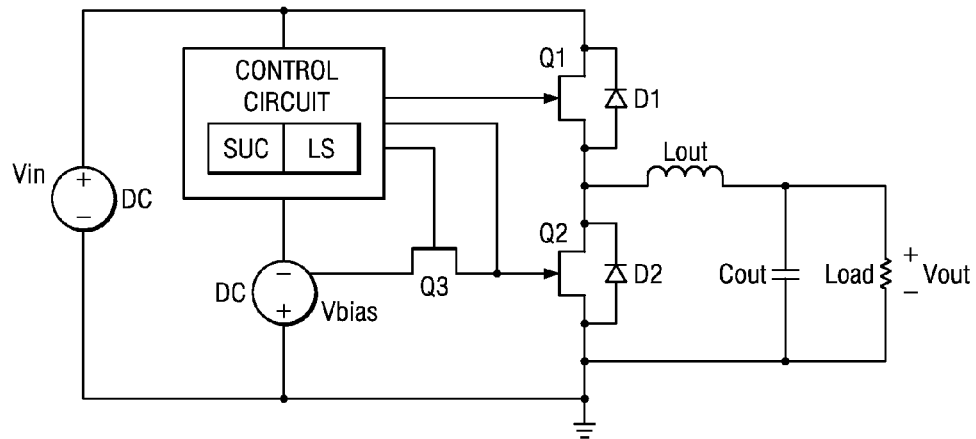
FIG. 4 illustrates a schematic diagram of another embodiment of a power converter constructed according to the principles of the present invention.

Turning now to FIG. 4, illustrated is a schematic diagram of another embodiment of a power converter constructed according to the principles of the present invention. The power converter employs a buck power converter topology with main and/or auxiliary switches Q1, Q2 being depletion mode switches such as group III-V compound semiconductor depletion mode switches. In conjunction with a protection circuit, a control circuit of the power converter includes a startup circuit (designated "SUC") and a level shifter (designated "LS"). The protection circuit includes a switch Q3 coupled to the startup circuit to assist in applying a drive signal having a negative value (e.g, a negative gate-to-source voltage) in connection with a bias supply to a control terminal (e.g., gate terminal) of the auxiliary switch Q2. The protection circuit may apply the negative gate-to-source voltage to the gate terminal of the auxiliary switch Q2 during transient conditions such as startup of the power converter or during any period of operation when the protection circuit determines that the auxiliary switch Q2 should be disabled to conduct, thereby limiting shoot-through current through the main and auxiliary switches Q1, Q2, or other potentially damaging actions. The remaining elements of the power converter are analogous to like elements illustrated and described with respect to the preceding FIGUREs and, in the interest of brevity, will not hereinafter be repeated.

Figure 5:
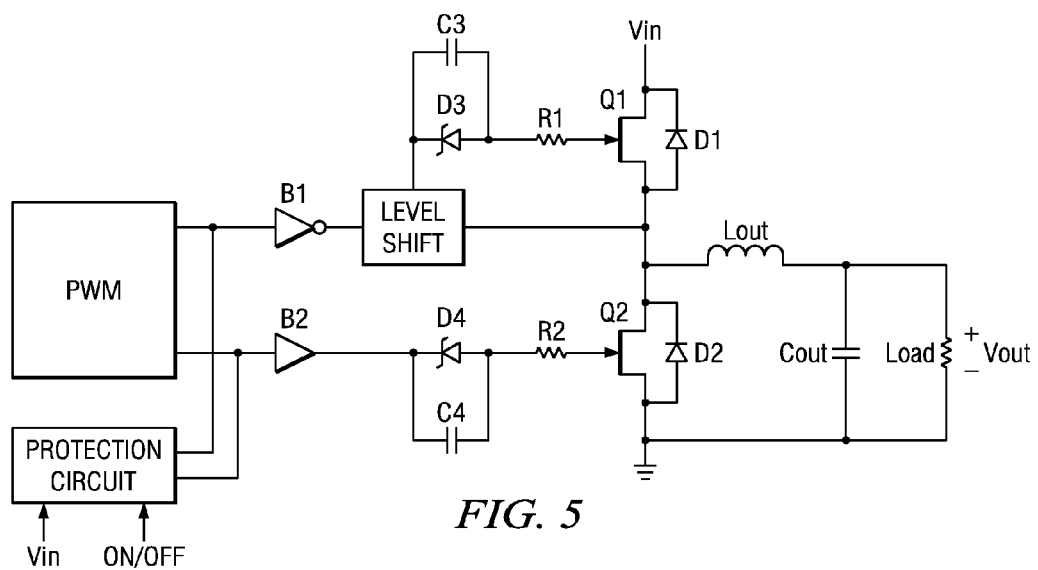
FIG. 5 illustrates a schematic diagram of another embodiment of a power converter constructed according to the principles of the present invention.

Turning now to FIG. 5, illustrated is a schematic diagram of another embodiment of a power converter constructed according to the principles of the present invention. The power converter employs a buck power converter topology with main and/or auxiliary switches Q1, Q2 being depletion mode switches such as group III-V compound semiconductor depletion mode switches. A protection circuit of the control circuit for the power converter is located between a pulse-width modulator and first and second drivers B1, B2 for the main and auxiliary switches Q1, Q2, respectively. The sections of the control circuit including the switch protection circuit may be powered in any of a variety of ways, including but not limited to, the input voltage Vin, a low drop-out regulator, or a bias supply. The switch protection circuit induces an application of a drive signal having a non-zero value such as a negative value to the control terminal to substantially disable the main and auxiliary switches Q1, Q2 in response to transient condition of the power converter. For instance, the protection circuit may detect the input voltage Vin to detect a startup condition of the power converter or include an on/off indicator to provide an indication when the power converter is operating or shut down.

In some instances, it may be desirable to replace the depletion mode main switch Q1 with a conventional enhancement mode switch such as an enhancement-mode silicon-based MOSFET. In such a configuration, the normally off enhancement mode switch may prevent current flow through the main switch Q1 during non-steady state operation such as the startup condition. However, the depletion mode auxiliary switch Q2 may still employ a protection circuit to prevent, for example, reverse current flow during shut down of the power converter, or during certain protection period including any transient condition of the power converter. Additionally, the main switch Q1 may be constructed using a quasi-enhancement mode switch, perhaps employing group III-V semiconductor materials. In such a quasi-enhancement mode switch, the switch manufacturing process varies to create a device that has a significant resistance at zero gate-to-source voltage, but perhaps orders of magnitude greater than the fully on resistance of the switch. It should also be understood that a quasi-enhancement mode switch may fall within the purview of a depletion mode switch. The remaining elements of the power converter are analogous to like elements illustrated and described with respect to the preceding FIGUREs and, in the interest of brevity, will not hereinafter be repeated.

Figure 6:
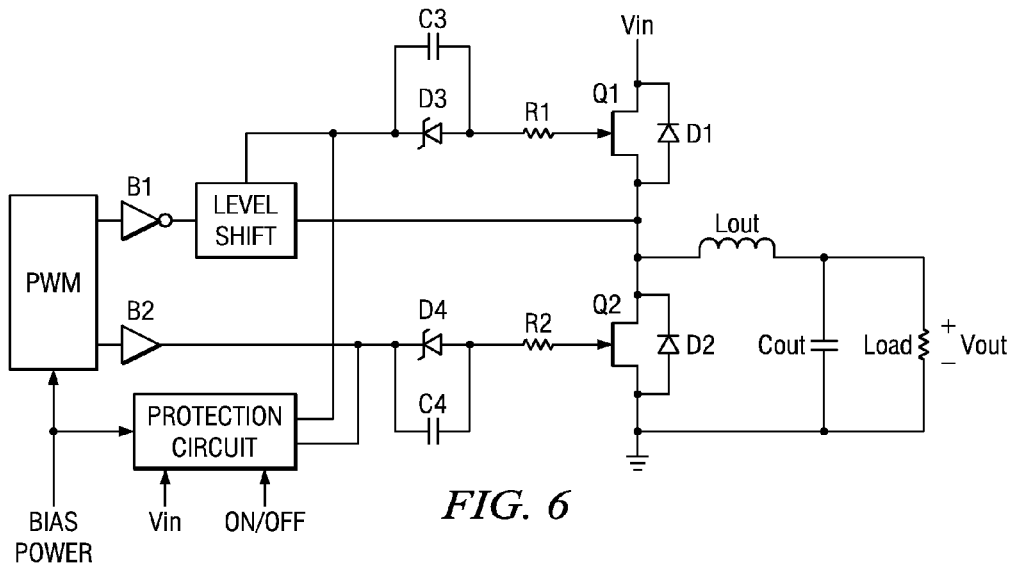
FIG. 6 illustrates a schematic diagram of another embodiment of a power converter constructed according to the principles of the present invention.

Turning now to FIG. 6, illustrated is a schematic diagram of another embodiment of a power converter constructed according to the principles of the present invention. The power converter employs a buck power converter topology with main and/or auxiliary switches Q1, Q2 being depletion mode switches such as group III-V compound semiconductor depletion mode switches. A protection circuit of the control circuit for the power converter is located between first and second drivers B1, B2 for the main and auxiliary switches Q1, Q2, respectively, and first and second dc offset circuits for the main and auxiliary switches Q1, Q2, respectively. Thus, the protection circuit is between a controller of the control circuit and the main and auxiliary switches Q1, Q2. The sections of the control circuit including the switch protection circuit may be powered in any of a variety of ways, including but not limited to, the input voltage Vin, a low drop-out regulator, or a bias supply. The switch protection circuit induces an application of a drive signal having a non-zero value such as a negative value to the control terminal to substantially disable the main and auxiliary switches Q1, Q2 in response to a transient condition of the power converter. For instance, the protection circuit may detect the input voltage Vin to detect a startup condition of the power converter or include an on/off indicator to provide an indication when the power converter is operating or shut down.

The protection circuit may include a driver configured in a high-impedance mode during normal operation, to not to interfere with the normal operation of the first and second drivers B1, B2 during steady state operation. Alternatively, the first and second drivers B1, B2 may be configured to operate in a high-impedance state, or unpowered, during a protection mode, so as to not to interfere with the operation of the protection circuit. Alternatively, the protection circuit may be directly coupled to a gate terminal of the main and auxiliary switches Q1, Q2 and apply a drive signal having a negative value employing a bias supply. In yet another embodiment, the first and second drivers B1, B2 could be controlled by a pulse-width modulator or the like to operate in a protection mode in addition to a steady state mode, thereby possibly eliminating the need for a separate driver to provide a switch-protection function. In such an embodiment, a control circuit monitors an operation of the power converter (e.g., an internal or external condition) to detect for a transient condition. When a transient condition is detected, the control circuit operates the first and second drivers B1, B2 in a switch protection mode, whereby a drive signal having a negative value is applied to the gate terminals of the main and auxiliary switches Q1, Q2. Of course, digital or analog control circuits may be employed to provide the aforementioned function. The bias power represents an internal or external bias supply for the control circuit.

Microcontrollers are often used in power converters to provide monitoring or housekeeping functions. A power converter employing one or more microcontrollers may monitor many of the characteristics of the power converter including, but not limited to, input voltage or input current, output voltage or output current, external digital or analog inputs such as an on/off control pin, a trim pin, a digital data bus, etc., and a variety of internal power converter state parameters to determine when a transient condition occurs and protection of a switch therein is necessary. A control circuit of the present invention including a pulse-width modulator and other circuit elements formed in a microcontroller may be embodied in a digital control circuit. The remaining elements of the power converter are analogous to like elements illustrated and described with respect to the preceding FIGUREs and, in the interest of brevity, will not hereinafter be repeated.

Figure 7:
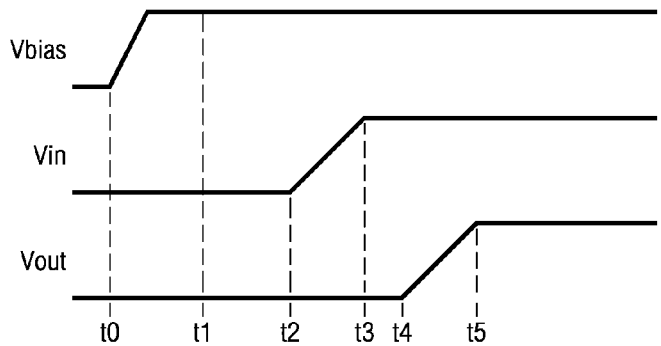
FIG. 7 illustrates a diagram of an embodiment of a start up timing relationship for a power converter constructed according to principles of the present invention.

Turning now to FIG. 7, illustrated is a diagram of an embodiment of a start up timing relationship and, in particular, a startup sequence for a power converter constructed according to principles of the present invention. A bias voltage Vbias begins increasing at a time t0. At a time t1, a protection circuit substantially disables conduction of one or more switches such as the main and auxiliary switches Q1, Q2 of a power converter previously described. At a time t2, the input voltage Vin begins rising, but the input current is controlled owing to the protection circuit having already configured one or more the switches substantially off at the time t1. At a time t3, the input voltage Vin is at its nominal level. At a time t4, a control circuit begins to soft-start the output voltage Vout in a controlled fashion. The protection circuit may be disabled sometime before, or during this period of time. At a time t5, the output voltage Vout is in regulation.

Figure 8:
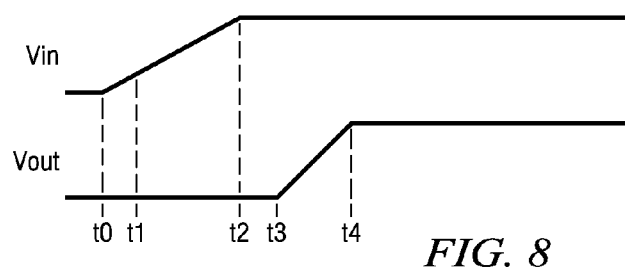
FIG. 8 illustrates a diagram of an embodiment of a start up timing relationship for a power converter constructed according to principles of the present invention.

Turning now to FIG. 8, illustrated is a diagram of an embodiment of a start up timing relationship and, in particular, a startup sequence for a power converter constructed according to principles of the present invention. For the illustrated embodiment, a protection circuit does not employ a separate bias supply. At time a t0, the input voltage Vin begins to rise. At a time t1, while the input voltage Vin is relatively low, the protection circuit comes alive and substantially disables conduction of one or more switches such as the main and auxiliary switches Q1, Q2 of a power converter previously described. At a time t2, the input voltage Vin is at its nominal level. At a time t3, a control circuit begins to soft-start the output voltage Vout in a controlled fashion. The protection circuit may be disabled sometime before, or during this period of time. At a time t4, the output voltage Vout is in regulation.

Figure 9:
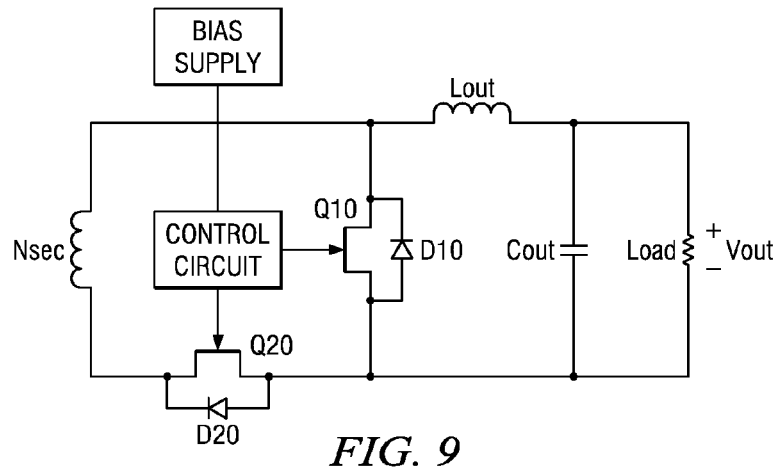
FIG. 9 illustrates a schematic diagram of an embodiment of a section of a power converter constructed according to the principles of the present invention.

Turning now to FIG. 9, illustrated is a schematic diagram of an embodiment of a section of a power converter constructed according to the principles of the present invention. In the instant case, the power converter is an isolated power converter and rectifier coupled to a secondary winding (designated "Nsec") of an isolation transformer is illustrated herein. The same or analogous basic principles apply to the isolated power converter as described above with respect to the non-isolated power converters. A switch protection circuit of a control circuit may advantageously use a signal present on a transformer winding to quickly disable or substantially disable conduction of first and second synchronous rectifier switches Q10, Q20. Alternatively, a separate bias supply or an output voltage Vout may be used to substantially disable conduction of the main and auxiliary switches Q10, Q20. A bias supply provides a bias voltage to the control circuit in the illustrated embodiment.

The control circuit may determine an appropriate time to disable the protection circuit and begin normal or steady state operation of the power converter. Analogous to the switches described above, the first and second synchronous rectifier switches Q10, Q20 are coupled to first and second diodes D10, D20, respectively. Alternatively, the first and second diodes D10, D20 may be formed as intrinsic body diodes of the first and second synchronous rectifier switches Q10, Q20, respectively. The remaining elements of the power converter are analogous to like elements illustrated and described with respect to the preceding FIGUREs and, in the interest of brevity, will not hereinafter be repeated.

Figure 10:
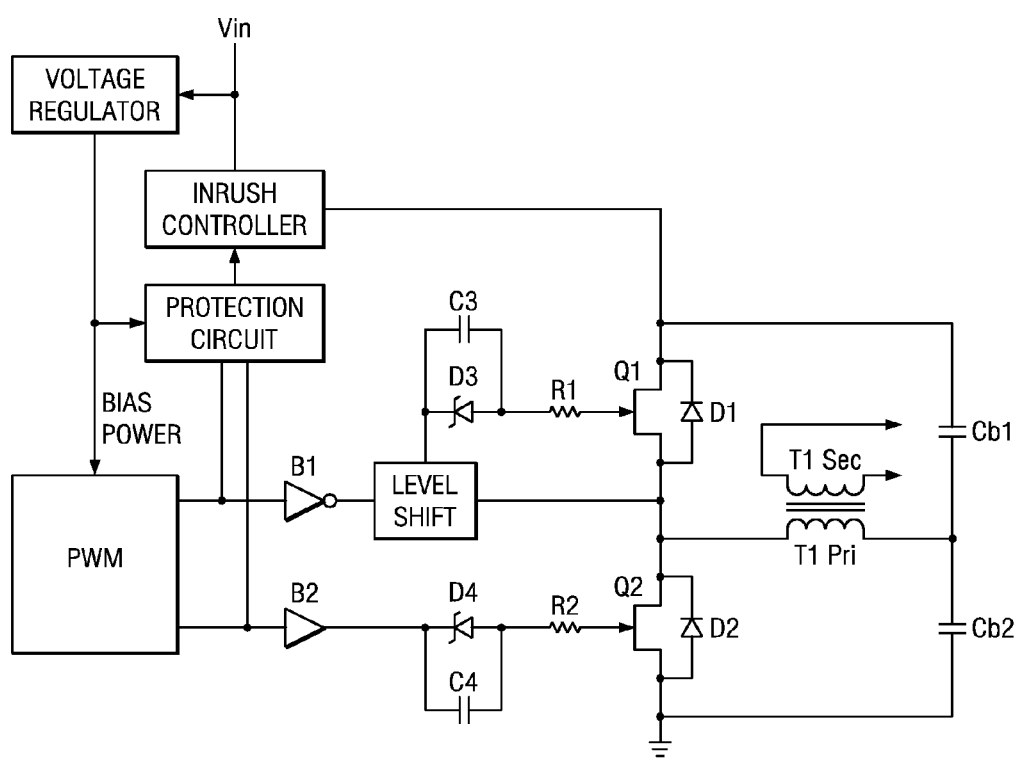
FIG. 10 illustrates a schematic diagram of an embodiment of a section of a power converter constructed according to the principles of the present invention.

Turning now to FIG. 10, illustrated is a schematic diagram of an embodiment of a section of a power converter constructed according to the principles of the present invention. The teachings and principles of the present invention are equally applicable to an inverter or "chopper" switches in an isolated power converter. The power converter employs a half-bridge power converter topology with a primary winding of an isolation transformer T1 coupled to a node between first and second switches Q1, Q2, and to another node coupled to first and second capacitors Cb1, Cb2. The secondary winding of transformer T1 is typically coupled to a rectifier (not shown) and to output nodes of the power converter. Again, the principles of the present invention may be applied to any switch-mode power converters or power converters including, without limitation, power converters with isolation transformers and to other power converter topologies such as bridge type, push-pull, flyback, active clamp, forward and boost power converter topologies.

The control circuit of the power converter includes an inrush controller (preferably active, but passive may also be applicable) employable to initially block an input voltage Vin from being applied to the first and second switches Q1, Q2. A protection circuit may advantageously derive its power before the inrush controller, allowing the protection circuit to substantially disable conduction of the first and second switches Q1, Q2 prior to the inrush controller applying the input voltage Vin thereto. The protection circuit is shown powered by a voltage regulator coupled to the input voltage Vin. The protection circuit may advantageously coordinate the operation of the various elements of the power converter to ensure orderly operation and protection of the first and second switches Q1, Q2 and the power converter in general.

Thus, a power converter has been introduced with a protection circuit for switches (e.g., depletion mode switches) that are substantially enabled to conduct with zero voltage (or substantially zero voltage) applied to a control terminal thereof. The protection circuit may operate not only during startup, but also during other transient conditions of the power converter including shut down. The protection circuit may operate directly from a source of electrical power or, alternatively, from another power source that operates before the normal input voltage is applied to the power converter. In a further embodiment, the protection circuit may provide one or more brief drive pulses (e.g., voltage pulses) to a control terminal of a switch to enable a bias circuit (such as a dc offset circuit with a zener diode in parallel with a capacitor) to produce a bias voltage for a control terminal of a switch before significant current can flow therethrough. It is further understood that the protection circuit may control any number of switches, and is not limited to the number of switches shown herein. The switch protection function may also be realized by a control circuit capable of operating the drivers in the appropriate mode of operation.

In a further embodiment, a protection circuit may be used with depletion mode switches such as group III-V compound semiconductor depletion mode switches that are enabled to conduct with zero volts (or substantially zero volts) applied to a control terminal (e.g., a gate terminal) of the switch. The group III-V semiconductor materials include such as gallium arsenide ("GaAs"), indium-phosphide ("InP"), or indium gallium arsenide ("InGaAs"), to cite just a few examples. The impedance of the switch at zero gate-to-source volts is substantially greater than the impedance with a positive gate-to-source voltage applied thereto. The switches are configured in such a manner to sustain some drain-to-source voltage without excessive currents. The switch is particularly useful in systems where the protection circuit derives its power directly (or indirectly) from the input (or output) voltage, without the advantage of a separate bias supply. Additionally, a modulation scheme is not limited to a pulse-width modulation method as described herein and other switch modulation schemes may be used to advantage.

Those skilled in the art should understand that the previously described embodiments of the control circuit including the protection circuit, the power converter and related methods of forming and operating the same, are submitted for illustrative purposes only. In addition, other embodiments capable of providing the advantages as described above are well within the broad scope of the present invention. While the circuit designs have been described as providing advantages in the environment of a power converter and, more generally, a power supply, other applications therefor are well within the broad scope of the present invention.

For a better understanding of power electronics, see *Principles of Power Electronics*, by J. G. Kassakian, M. F. Schlecht and G. C. Verghese, Addison-Wesley (1991). For a better understanding of converter topologies, control techniques, gate-drive techniques, device structures and compositions, see the following patents, namely, U.S. Pat. No. 5,889,298, entitled Vertical JFET Field Effect Transistor, to Plumton, et al., issued Mar. 30, 1999, U.S. Pat. No. 5,342,795, entitled Method of Fabricating Power VFET Gate-Refill, to Yuan, et al., issued Aug. 30, 1994, U.S. Pat. No. 5,468,661, entitled Method of Making Power VFET Device, to Yuan, et al., issued Nov. 21, 1995, U.S. Pat. No. 5,610,085, entitled Method of Making a Vertical FET Using Epitaxial Overgrowth, to Yuan, et al., issued Mar. 11, 1997, U.S. Pat. No. 5,624,860, entitled Vertical Field Effect Transistor and Method, to Plumton, et al., issued Apr. 29, 1997, U.S. Pat. No. 5,920,475, entitled Circuit and Method for Controlling a Synchronous Rectifier Converter, to Boylan, et al., issued Jul. 6, 1999, U.S. Pat. No. 5,956,245, entitled Circuit and Method for Controlling a Synchronous Rectifier Converter, to Rozman, issued Sep. 21, 1999, U.S. Pat. No. 6,038,154, entitled Circuit and Method for Controlling a Synchronous Rectifier Converter, to Boylan, et al., issued Mar. 14, 2000, U.S. Pat. No. 6,191,964, entitled Circuit and Method for Controlling a Synchronous Rectifier Converter, to Boylan, et al., issued Feb. 20, 2001, U.S. Pat. No. 6,218,891, entitled Integrated Circuit Including a Driver for a Metal-Semiconductor Field-Effect Transistor, to Lotfi, et al., issued Apr. 17, 2001, U.S. Pat. No. 5,374,887, entitled Inrush Current Limiting Circuit, to Drobnik, issued Dec. 20, 1994, U.S. Pat. No. 6,741,099, entitled Transistor Driver Circuit, to Krugly, issued May 25, 2004, U.S. Pat. No. 6,661,276, entitled MOSFET Driver Matching Circuit for an Enhancement Mode JFET, to Chang, issued Dec. 9, 2003, and the following publications, namely, 10 MHz PWM WMConverters with GaAs VFETs, by Kollman, et al., Eleventh Annual Applied Power Electronics Conference and Exposition, 1996, Conference Proceedings, volume 1, pp. 264-269, Mar. 3-7, 1996, *Comparison of GaAs and Silicon Synchronous Rectifiers in a 3.3 V Out, 50 W DC-DC Converter*," by Niemela, et al., 27th Annual IEEE Power Electronics Specialists Conference, PESC '96 Record., volume 1, pp. 861-867, 23-27 Jun. 1996, A 50-100 MHz 5 V to -5 V, 1 W Cuk Converter Using Gallium Arsenide Power Switches, by Gaye, et al., The 2000 IEEE International Symposium on Circuits and Systems, 2000, vol. 1, pp. 264-267, May 2000, A Low On-Resistance, High-Current GaAs Power VFET, by Plumton, et al., IEEE Electron Device Letters, Volume: 16, Issue: 4, Apr. 1995, pp. 142-144, Manufacturable GaAs VEET for Power Switching Applications, by Eisenbeiser, et al., IEEE Electron Device Letters, Vol. 21, Issue 4, Apr. 2000, pp. 144-145, Ultrahigh Frequency *DC-to-DC Converters Using GaAs Power Switches*, by Ajram, et al., IEEE Transactions on Power Electronics, Vol. 16, Issue 5, Sep. 2001, pp. 594-602, *Radio Frequency DC-DC Flyback Converter*, by Biernacki, et al., Proceedings of the 43rd IEEE Midwest Symposium on Circuits and Systems, Vol. 1, pp. 94-978, 11 Aug., 2000, Application Note AN100, PowerJFET®s in Buck Converters, Sep. 2003, Lovoltech Inc., 3970 Freedom Circle, Suite 101, Santa Clara, Calif. 95054, Application Note AN101, Gate Drive Network for a PowerJFET®, November 2003, Lovoltech Inc., 3970 Freedom Circle, Suite 101, Santa Clara, Calif. 95054, and Application Note AN108, *Using Power JFETs and MOSFETs Interchangeably in Low-Side Applications*, February 2005, Lovoltech Inc., 3970 Freedom Circle, Suite 101, Santa Clara, Calif. 95054, all of which are incorporated herein by reference as though they are reproduced herein in their entirety. For related applications, see U.S. patent application Publication No. 2006/0187684, entitled Power Converter Employing Integrated Magnetics with a Current Multiplier Rectfler and Method of Operating the Same, to Chandrasekaran, et al. published Aug. 24, 2006, and U.S. Pat. No. 7,176,662, entitled Power Converter Employing a Tapped Inductor and Integrated Magnetics and Method of Operating the Same, to Chandrasekaran, issued Feb. 13, 2007, which are also incorporated herein by reference.

Also, although the present invention and its advantages have been described in detail, it should be understood that various changes, substitutions and alterations can be made herein without departing from the spirit and scope of the invention as defined by the appended claims. For example, many of the topology and circuits discussed above can be implemented in different methodologies and replaced by other topology and circuit designs, or a combination thereof, to advantageously form power converters providing improved reliability and performance of a power converter as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A control circuit for a power converter employing a switch enabled to conduct when substantially zero volts is applied to a control terminal thereof, comprising:
   a controller configured to control said switch by providing a drive signal to said control terminal thereof as a function of a characteristic of said power converter; and
   a protection circuit configured to induce an application of a drive signal having a negative value derived from a bias voltage to said control terminal to substantially disable said switch when an input voltage is applied to said power converter.

2. The control circuit as recited in claim 1 wherein said controller includes a pulse-width modulator configured to provide a control signal to control said switch as a function of a characteristic of said power converter.

3. The control circuit as recited in claim 1 further comprising at least one driver coupled to said control terminal of said switch operable in a high-impedance state.

4. The control circuit as recited in claim 1 wherein said bias voltage is derived from one of a bias supply, a low drop-out regulator and a dc offset circuit.

5. The control circuit as recited in claim 1 wherein said switch is a group III-IV compound semiconductor switch.

6. The control circuit as recited in claim 1 wherein said protection circuit is configured to induce an application of said drive signal having said negative value derived from said bias voltage to said control terminal to substantially disable said switch in response to a transient condition of said power converter.

7. The control circuit as recited in claim 1 wherein said protection circuit includes a charge pump.

8. The control circuit as recited in claim 1 wherein said protection circuit includes a startup circuit and a protection circuit switch configured to apply said drive signal having said negative value derived from said bias voltage to said control terminal in connection with a bias supply.

9. The control circuit as recited in claim 1 further comprising an inrush controller and voltage regulator configured to cooperate with said protection circuit to induce an application of said drive signal having said negative value derived from said bias voltage to said control terminal.

10. The control circuit as recited in claim 1 wherein said switch is a synchronous rectifier switch.

11. A method of operating a power converter employing a switch enabled to conduct when substantially zero volts is applied to a control terminal thereof, comprising:
    controlling said switch by providing a drive signal to said control terminal thereof as a function of a characteristic of said power converter; and
    inducing an application of a drive signal having a negative value derived from a bias voltage to said control terminal to substantially disable said switch when an input voltage is applied to said power converter.

12. The method as recited in claim 11 wherein said controlling includes providing a control signal with a pulse-width modulator to control said switch as a function of a characteristic of said power converter.

13. The method as recited in claim 11 wherein said providing said drive signal is performed by at least one driver operable in a high-impedance state.

14. The method as recited in claim 11 wherein said bias voltage is derived from one of a bias supply, a low drop-out regulator and a dc offset circuit.

15. The method as recited in claim 11 wherein said switch is a group III-IV compound semiconductor switch.

16. The method as recited in claim 11 wherein said protection circuit is configured to induce an application of said drive signal having said negative value derived from said bias voltage to said control terminal to substantially disable said switch in response to a transient condition of said power converter.

17. The method as recited in claim 11 wherein said inducing is performed by a protection circuit including a charge pump.

18. The method as recited in claim 11 wherein said inducing is performed by a protection circuit including a startup circuit and a protection circuit switch to apply said drive signal having said negative value derived from said bias voltage to said control terminal in connection with a bias supply.

19. The method as recited in claim 11 wherein said inducing is performed by a protection circuit in cooperation with an inrush controller and a voltage regulator to apply said drive signal having said negative value derived from said bias voltage to said control terminal.

20. The method as recited in claim 11 wherein said switch is a synchronous rectifier switch.

* * * * *

UNITED STATES PATENT AND TRADEMARK OFFICE
CERTIFICATE OF CORRECTION

PATENT NO. : 7,385,375 B2 Page 1 of 1
APPLICATION NO. : 11/361914
DATED : June 10, 2008
INVENTOR(S) : Rozman It is certified that error appears in the above-identified patent and that said Letters Patent is hereby corrected as shown below:

On the Title Page, Section (56) References Cited, U.S. PATENT DOCUMENTS, Page 2, 2nd Column, 12th entry, delete "5/2002" and insert --3/2002--.
On the Title Page, Section (56) References Cited, OTHER PUBLICATIONS, Page 3, 1st Column, 8th entry, delete "Modulation, Doped" and insert --Modulation-Doped--.
On the Title Page, Section (56) References Cited, OTHER PUBLICATIONS, Page 3, 1st Column, 10th entry, delete "High Current" and insert --High-Current--.
In Col. 4, line 15, delete "sueh" and insert --such--.
In Col. 12, line 28, delete "WMConverters" and insert --Converters--.
In Col. 12, line 42, delete "VEET" and insert --VFET--.
In Col. 12, line 64, delete "Rectfler" and insert --Rectifier--.

Signed and Sealed this

Thirtieth Day of December, 2008

JON W. DUDAS
*Director of the United States Patent and Trademark Office*